United States Patent
Miyazaki et al.

(10) Patent No.: US 9,638,781 B2
(45) Date of Patent: May 2, 2017

(54) ENHANCEMENT OF MT EFFECT AND/OR CEST EFFECT

(71) Applicant: TOSHIBA MEDICAL SYSTEMS CORPORATION, Tochigi (JP)

(72) Inventors: Mitsue Miyazaki, Des Plaines, IL (US); Cheng Ouyang, Buffalo Grove, IL (US); Xiangzhi Zhou, Vernon Hills, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 627 days.

(21) Appl. No.: 14/171,167

(22) Filed: Feb. 3, 2014

(65) Prior Publication Data

US 2015/0219735 A1   Aug. 6, 2015

(51) Int. Cl.
*G01R 33/56* (2006.01)

(52) U.S. Cl.
CPC ................ *G01R 33/5605* (2013.01)

(58) Field of Classification Search
CPC .................................. G01R 33/5605
See application file for complete search history.

(56) References Cited

U.S. PATENT DOCUMENTS

| | | | |
|---|---|---|---|
| 5,557,202 A | 9/1996 | Miyazaki et al. | |
| 6,320,377 B1* | 11/2001 | Miyazaki | A61B 5/055 324/306 |
| 7,254,437 B2 | 8/2007 | Miyazaki | |
| 8,131,338 B2 | 3/2012 | Kassai et al. | |
| 8,560,049 B2 | 10/2013 | Kassai et al. | |
| 2002/0188190 A1* | 12/2002 | Kassai | G01R 33/5673 600/410 |
| 2004/0059213 A1* | 3/2004 | Kassai | A61B 5/055 600/410 |
| 2014/0062473 A1* | 3/2014 | Miyazaki | G01R 33/50 324/308 |
| 2014/0062476 A1* | 3/2014 | Miyazaki | G01R 33/5605 324/309 |
| 2014/0361776 A1* | 12/2014 | Miyazaki | G01R 33/5605 324/322 |

OTHER PUBLICATIONS

Van Zijl et al., Chemical Exchange Saturation Transfer (CEST): What is in a Name and What Isn't?, Magnetic Resonance in Medicine 65:927-948 (2011).

Wolff et al., Magnetization Transfer Contest (MTC) and Tissue Water Proton Relaxation in Vivo, Magnetic Resonance in Medicine 10, 135-144 (1989).

* cited by examiner

*Primary Examiner* — Rodney Bonnette
(74) *Attorney, Agent, or Firm* — Nixon & Vanderhye P.C.

(57) ABSTRACT

A magnetic resonance imaging (MRI) system, method and/or computer readable storage medium is configured to effect enhanced magnetic transfer (MT) effects and chemical exchange saturation transfer (CEST) effects. The configured techniques include irradiating an object in an MRI gantry by applying a sequence of magnetic transfer (MT) pulses over a range of different frequencies, and then applying an MR imaging sequence to the irradiated object.

20 Claims, 6 Drawing Sheets

ENHANCEMENT OF MT EFFECT AND/OR CEST EFFECT

FIELD

The subject matter below relates generally to magnetic resonance imaging (MRI), and more particularly to systems, methods, and computer readable storage medium for techniques of enhancing the magnetic transfer (MT) effects and/or chemical exchange saturation transfer (CEST) effect in MRI.

DETAILED DESCRIPTION

Figure 1:
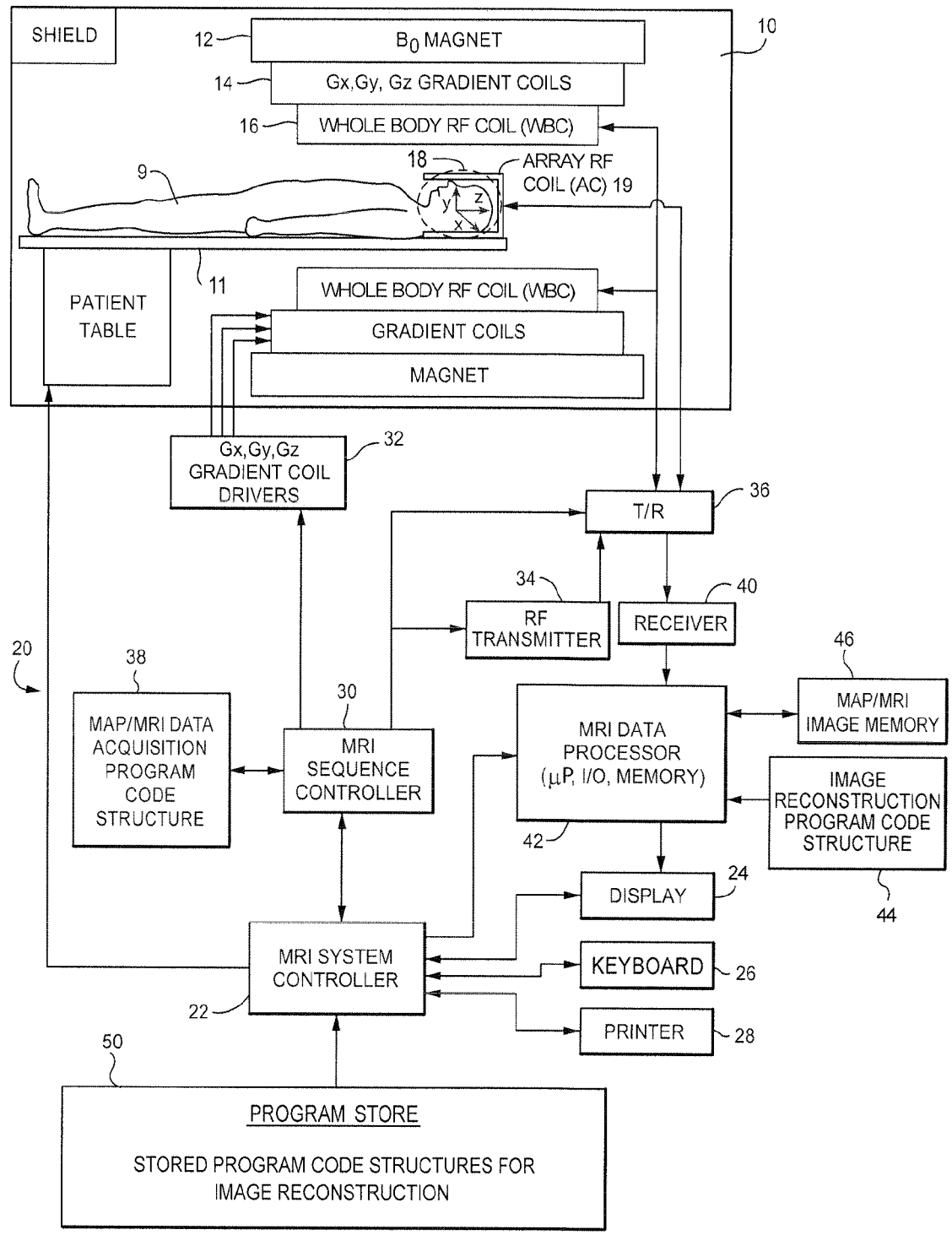
FIG. 1 is a high-level schematic block diagram of an MRI system, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing a portion of the body of patient 9 supported by a patient table 11. A smaller array RF coil (AC) 19 might be coupled to a portion of the patient. The part of patient 9 that is subject to scanning using RF coil 19 is referred to herein, for example, as "scanned object" or "object" in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from an object, such as the part of the patient body in the example above, in the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may operated to provide the MRI sequence controller 30 information about a pulse sequence and managing the operations of the entire system, according to installed software programs. The MRI system controller 22 may also serve as an element for instructing a patient to perform tasks, such as, for example, a breath hold by a voice massage produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coil.

The MRI system 20 includes an RF receiver 40 providing input to data processor 42 so as to create processed image data, which is sent to display 24. The MRI data processor 42 is also configured for access to system configuration parameters 46 and MRI image reconstruction program code structures 44 and 50. MRI image reconstruction program code structures 44 and 50 may, in addition to control logic for reconstructing MRI images, also include control logic to obtain MR data from RF coils 16 and/or 19. The MRI data processor 42 also operates to execute methods, such as, method 600 shown in FIG. 6 or parts thereof to obtain images utilizing enhanced MT effects.

Although shown in FIG. 1 as being located away from the RF coils 16 and 19, in some embodiments, any of RF transmitter 34, transmit/receive switch 36, and RF receiver 40 may be located in close proximity to, or on a surface of, either or both RF coils 16 and 19.

Also illustrated in FIG. 1 is a generalized depiction of an MRI system program store 50 where stored program code structures (e.g., for image reconstruction, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

Example embodiments described herein may be applicable for MR imaging of any object in which MT effects and/or CEST effects can be used to improve the contrast of the images for diagnosis or other uses. During the scanning process, with the object located in the MRI gantry, one or more RF coils, such as whole body coil 16 and/or array coil 19, may transmit RF pulses to selected parts of the object in order to excite nuclear magnetic resonance (NMR) spins in particular parts of the object. For example, array coil 19, which is placed in the example at an area of the patient's body, may be used to excite nuclear spins specifically in that area. Subsequently, MR signals (e.g. echo signals) which are generated as a result of the earlier excitation are received by one or more RF receive coils. The transmitting of the RF pulses and the receiving of the MR signals may be done using the same RF coil (e.g. RF coil 19 configured for both transmit RF excitation pulses and receive corresponding MR signals) or by different RF coils (e.g. WBC 16 is configured to transmit RF pulses and RF coil 19 is configured to receive corresponding MR signals). In order to generate MRI images that are used for diagnostic or other purposes, data corresponding to the received MR signals must be communicated to a control system, such as a processing system including MRI data processor 42, for processing.

MT effects (or what may be referred to as MTC—magnetization transfer contrast effects) are used, for example, to produce images that utilize image contrast between blood (e.g., flow of blood) and tissue in applications such as, but not limited to, MR angiography (MRA). MT effects are based on chemical exchanges and/or cross relaxation between protons (e.g. hydrogen nuclei) of multiple types of nuclear pools, such as free water (also referred to as bulk water) and various macromolecules. Each of the multiple types of nuclear pools may have protons that are bound differently and have different Larmor frequencies than protons in the other nuclear pools.

The T2 relaxation time of free water is longer (approx. 100 msec) than the T2 relaxation time of macromolecules (approx. 0.1 to 0.2 msec). Since the T2 relaxation time of a free water signal is longer, its Fourier-transformed signal has a peak with a relatively narrow half-width. However, in the case of the signal of protons whose movement is restricted among macromolecules, such as protein, its Fourier-transformed signal has a relatively broader half-width value, due to a shorter T2 relaxation time, and may not appear as a distinct peak in the spectra during data acquisition.

An "MT pulse" is an RF pulse that causes MT effects in, for example, free water and macromolecules. When considering the resonance peak frequency $F_0$ of free water as the center frequency, a frequency-selective pulse serving as an MT pulse is applied to excite a frequency range shifted, for example, by 500 Hz from the center frequency $F_0$ of free water (that is, off-resonance excitation). This excitation causes the magnetization of free water and of selected macromolecules, both of which are in equilibrium at the time, to change relative to one another as the magnetization of free water moves to the magnetization of macromolecules. As a result of the movement, the signal from free water decreases. Differences in signal are caused between one region in which the MT effect chemical exchanges and/or cross relaxation between free water and macromolecules occur and another region in which the MT effect does not occur (or occurs to a substantially lesser degree). These differences are used in order to observe the contrast between, for example, flow of blood and tissue or other areas or objects of interest.

According to some embodiments, MRI data acquisition includes applying a pulse sequence having an MT pulse sequence and an imaging pulse sequence. As the imaging pulse sequence in embodiments, a two-dimensional (2D) scan or a three-dimensional (3D) scan can be adopted. Example, available pulse sequences include an SE (spin echo) sequence, FE (field gradient echo) sequence, FSE (Fast SE) sequence, FASE (Fast asymmetric SE) sequence, and others.

MT pulses are applied before the imaging pulses. Typically, before the imaging pulse sequence (also referred to as a main sequence), a pre-sequence including RF pulses functioning as MT pulses is applied. The pre-sequence may include gradient spoiler pulses applied to any one or more axis directions (slice, phase-encoding, and readout directions).

MT pulses may be applied slice-selectively or non-selectively. MT pulses are made up of RF pulses for NMR excitation which are individually formed by a truncated sinc function, for example. An MT pulse may also be made up of an RF pulse in accordance with a Gaussian function. MT pulses are formed by modulating, e.g., with a sinc function, RF pulses each having a desired frequency offset. Binomial pulses, such as described in U.S. Pat. No. 5,557,202 to Miyazaki et al, which is hereby incorporated in its entirety by reference, may also be used as MT pulses. The number of MT pulses applied in a sequence of pulses during an imaging cycle is a number, such as, for example, 10 pulses or 40 pulses.

The application of MT pulses to an area of an object being scanned causes MT effects between bound protons nutating at a selected frequency and free water in that area. The MT effect causes a signal from the selected bound protons to decrease by an amount larger than that of free water, thereby increasing the contrast between the corresponding areas in the image.

Chemical exchange saturation transfer (CEST) is another technique, similar to MTC, for improving contrast in MRI. In imaging with the CEST effect, selective RF irradiation of exchangeable protons of macromolecules, such as amide (—NH), hydroxyl (—OH), and amine (—NH2), is detected through progressive saturation of the water signal consequent to chemical exchange. In CEST, transfer of magnetization is observed in mobile compounds instead of semisolids for which MTC is used. Similar to MTC, CEST has contributions of both chemical exchange and dipolar cross-relaxation, but the latter can often be neglected if exchange is fast. Contrary to MTC, CEST imaging requires sufficiently slow exchange on the MR time scale to enable selective irradiation of the protons of interest. (Peter C. M. van Zilj et al, "Chemical Exchange Saturation Transfer (CEST): What is in a Name and What Isn't?," MRM, 65:927-948 (2011)).

As discussed above, the MT effect and the CEST effect can be triggered by saturating exchangeable macromolecule protons that resonate at a frequency different from free water protons, and having that saturation transferred to the free water when the solute protons exchange with free water. The free water signal is attenuated due to the transfer. However, because the water pool is generally much larger than the macromolecule pool, for the attenuation of the water signal due to the MT effect/CEST effect to be visible, the saturation typically has to be performed for more than a single pulse, and possibly, a plurality of pulses such as, for example, a sequence of 40 MT-pulses.

The efficiency of the MT effect and/or CEST effect is typically expressed in terms of a signal or magnetization reduction due to the resulting MT effect or CEST effect. The frequency-dependent saturation effects caused by CEST effects may be visualized by plotting the water saturation normalized by the signal without saturation as a function of saturation frequency. This yields a "Z-spectrum" (see FIG. 2). The Z-spectrum is characterized by the symmetric direct saturation around the water frequency $F_0$ (in other words, the Z-spectrum is illustrated with 0 ppm (parts per million) assigned to the water frequency).

According to conventional techniques, the MT effect and CEST effect are observed by applying a selected single frequency MT pulse or pulsed MT pulse to irradiate the selected frequency from either side of the center frequency of water or $F_0$. Typically, multiple MT pulses (e.g., a sequence of MT pulses at the selected frequency) are applied to obtain an efficient MT effect.

According to conventional techniques, for each application of a selected frequency in the CEST spectrum, the CEST effect may be caused by elevating signals of hydroxyl, amine, and amide protons, separately. For example, the CEST effect can be obtained by irradiating the particular frequency of hydroxyl (1 ppm), amine (approximately 2 ppm) and amide protons (approximately 3.5 ppm), where the ppm values are specified relative to the free water frequency $F_0$.

However, the CEST effect caused by excitation in a single frequency is relatively small. For example, in normal tissue, the effect of signal gain by CEST effect is about 2-3% for the normal tissue on the particular frequency.

Moreover, if multiple types of protons, each with a different resonance frequency, are associated in chemical exchanges or magnetization transfer processes with free water, irradiating a single frequency would not enable one to observe the complex effect of magnetization transfer of the multiple types of protons.

Further, having a number of MT pulses of the same frequency in a pulse sequence, with each MT pulse having a high flip angle (e.g., 200-500 degrees), as used in conventional techniques, may result in exceeding limits, such as a specific absorption rate (SAR) for energy received by the patient from the MRI process.

Thus, in order to observe MT effects and/or CEST effects from multiple types of protons with free water, in embodiments disclosed herein, multiple frequency irradiation pulses are applied in an MT pulse sequence. The frequency range for the MT pulse sequence includes the resonance frequencies of one or more macromolecules or frequencies at which one or more selected chemical shifts occur between free water and other types of molecules resulting in the transfer of magnetization.

In embodiments, the observed MT effect/CEST effect is maximized by simultaneously causing MT effects/CEST effects in multiple types of bound protons due the application of multiple frequencies within an MT pulse sequence.

According to an embodiment, a 40 MT pulse sequence is used to irradiate various frequencies such as selected frequencies from 1 to 3.5 ppm. The pulse sequence may include the first pulse applied at 3.5 ppm, the second pulse applied at 2 ppm and the third pulse applied at 1 ppm (e.g., at 3 T, 1 ppm=128 Hz), and repeated until the total number of MT pulses in the MT pulse sequence is a total of 40 pulses.

Figure 2:
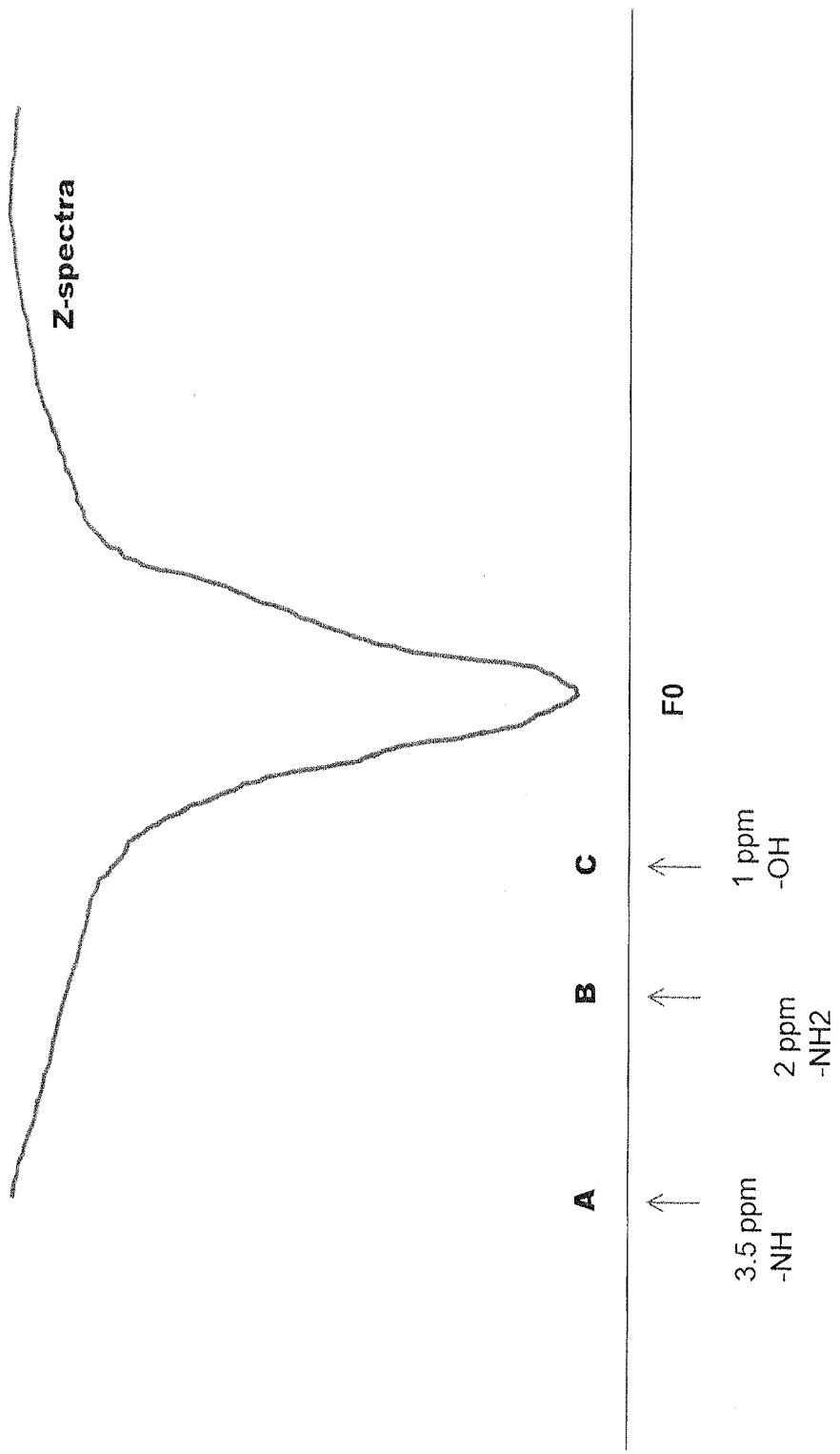
FIG. 2 illustrates an example of the Z-spectra (e.g., of free water) and the relative frequency offsets for selected macromolecules.

FIG. 2 illustrates an example of the Z-spectra (e.g., of free water) and the relative frequencies for selected macromolecules. The resonance frequencies of amide, amine and hydroxyl macromolecules are offset approximately 3.5 ppm, 2 ppm, and 1 ppm, respectively, relative to the free water resonance frequency $F_0$ (e.g., 128 MHz at 3 T). In FIGS. 2, A, B, and C represent the NMR frequencies, respectively, of, amide, amine and hydroxyl.

Figure 3:
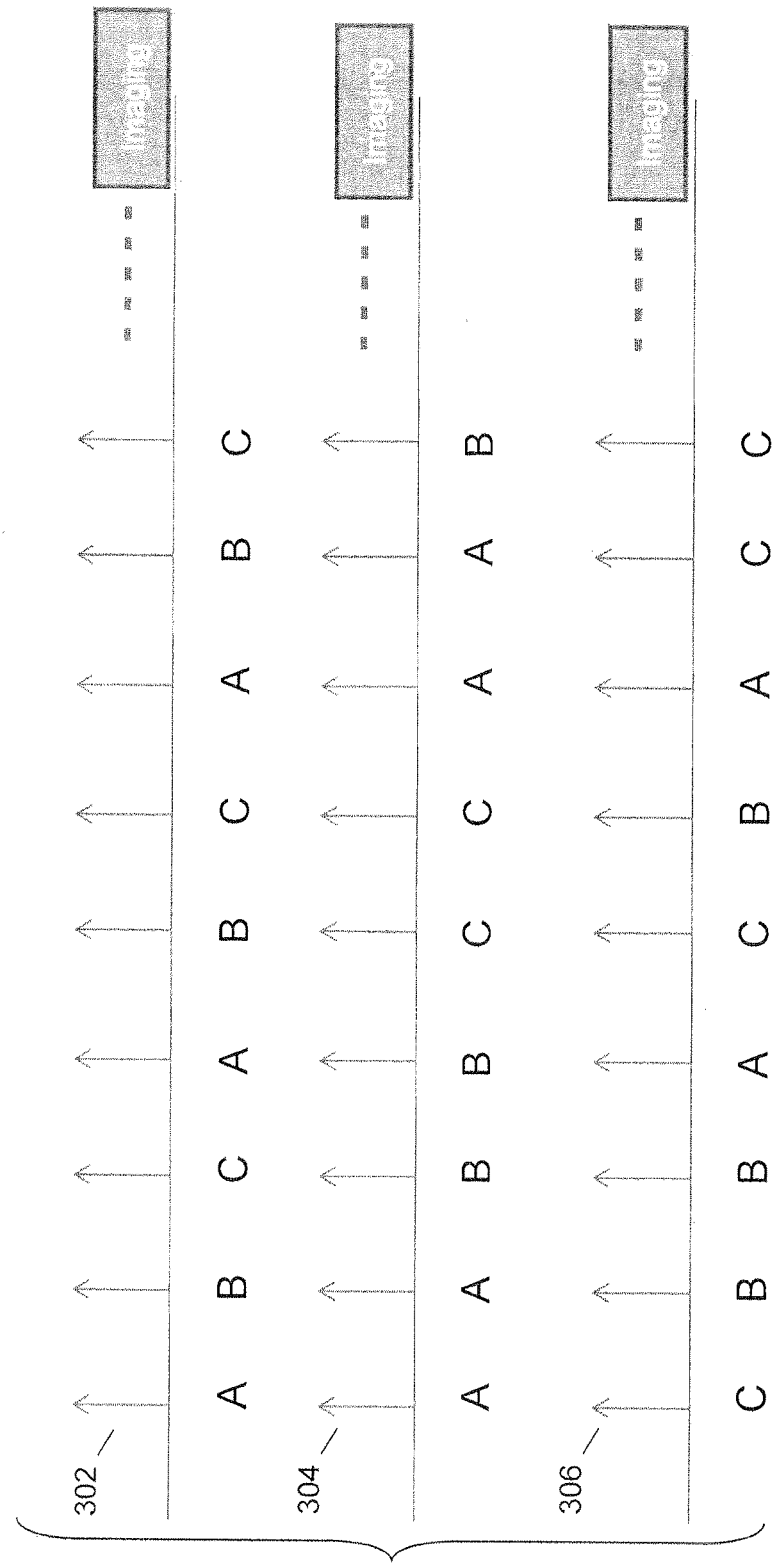
FIG. 3 is a representation of pulse sequences comprising the MT pulses of multiple frequencies, in accordance with one or more embodiments.

FIG. 3 illustrates example pulse sequences 302-306, each comprising a sequence of multiple frequency MT pulses, followed by an MR imaging pulse sequence for data acquisition. For example, MT-pulses of frequencies A, B and C (A, B and C may be, for example, the frequencies corresponding to amide, amine and hydroxyl macromolecules, e.g., spaced 3.5 ppm, 2 Ppm, and 1 ppm from $F_0$ on the frequency spectrum) can be arranged in any order, e.g., a repeating pattern of the three different frequencies, such as A-B-C, or A-B-C-A-C-B. Two frequencies, such as A and B, may be ordered, for example, in a repeating pattern of A-B-A-B, until the end of the MT sequence, or in any other manner, like A-A-A-A-B-B-B-B, A-B-B-A-A-B-B-A-A-B-B-A, etc. In some embodiments, the multiple frequencies may be randomly arranged in the pulse sequence. As would be understood, in each of FIGS. 2-5, a pulse is illustrated as a point in a time line to show its relative position with respect to other pulses in the pulse sequence, without regard to RF pulse envelope characteristics such as amplitude, bandwidth, and the like.

By configuring the ordering of multiple frequency MT pulses in the sequences, embodiments provide for applications of MT effects in which the frequency range, the number of different frequencies or how many different types of protons, and/or the order of MT pulses in the pulse sequence from each of the different types of protons, can be controlled.

Figure 4:
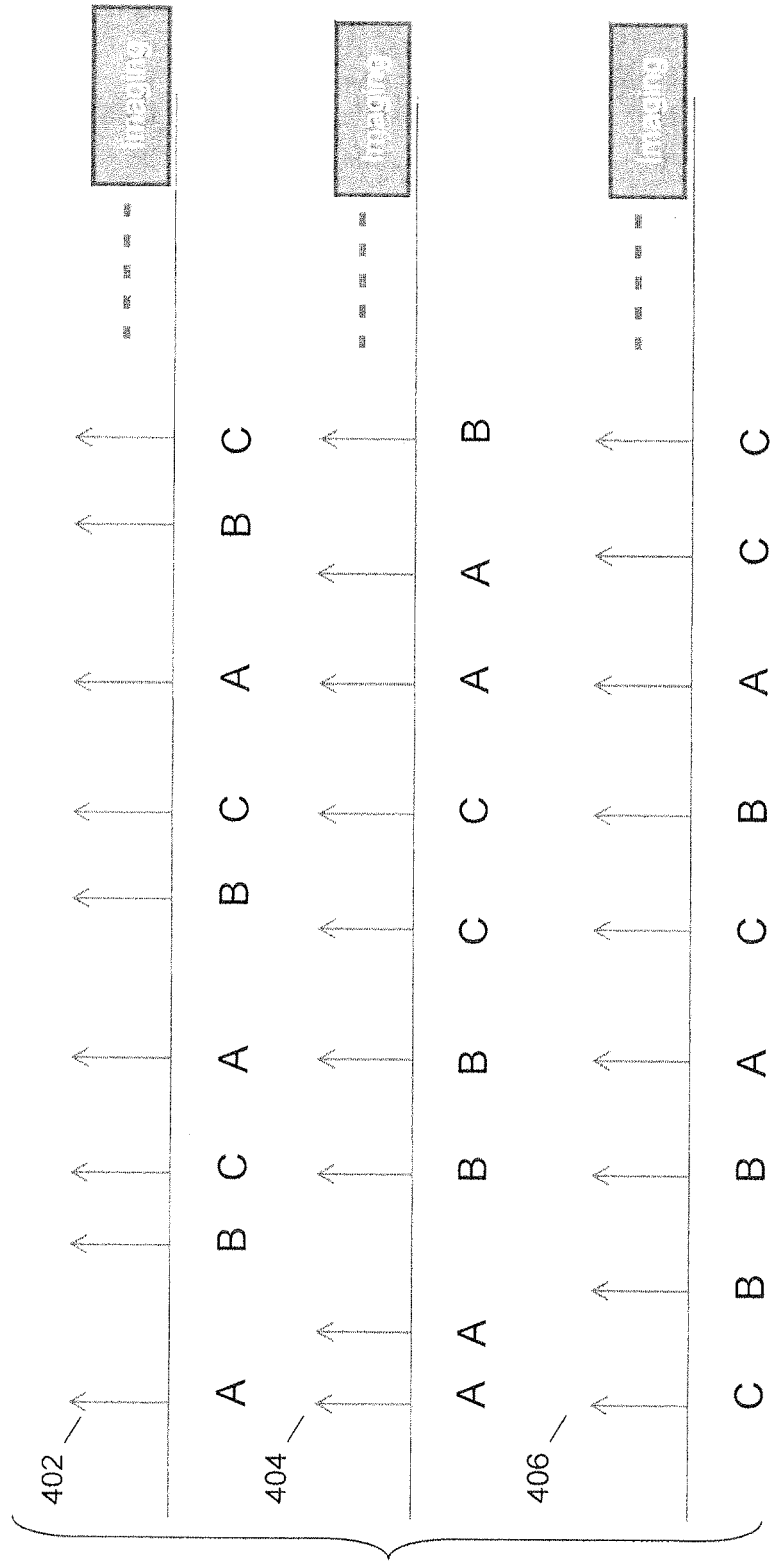
FIG. 4 is a representation of pulse sequences, each comprising MT pulses of multiple frequencies arranged such that the time intervals between adjacent pulses are varied.

FIG. 4 illustrates three pulse sequences 402-406, each comprising MT pulses of multiple frequencies arranged such that the time intervals between adjacent pulses are varied before the imaging sequence occurs. According to the illustrated embodiments, the time interval between pulses may be configured based upon relaxation properties of the target protons being irradiated by each pulse. For example, as shown in pulse sequence 402, the time interval between A and B pulses may be greater than the interval between B and C pulses.

The ability to control the duration between MT pulses of different frequencies permits for improving the MT effects and/or CEST effects observed. For example, the duration between MT pulses of different frequencies may be configured such that interactions/exchanges between the protons of the respective different frequencies are accelerated. Normally, multiple MT pulses are applied in a continuous manner substantially without delay in between MT pulses to yield better MT effects.

Figure 5:
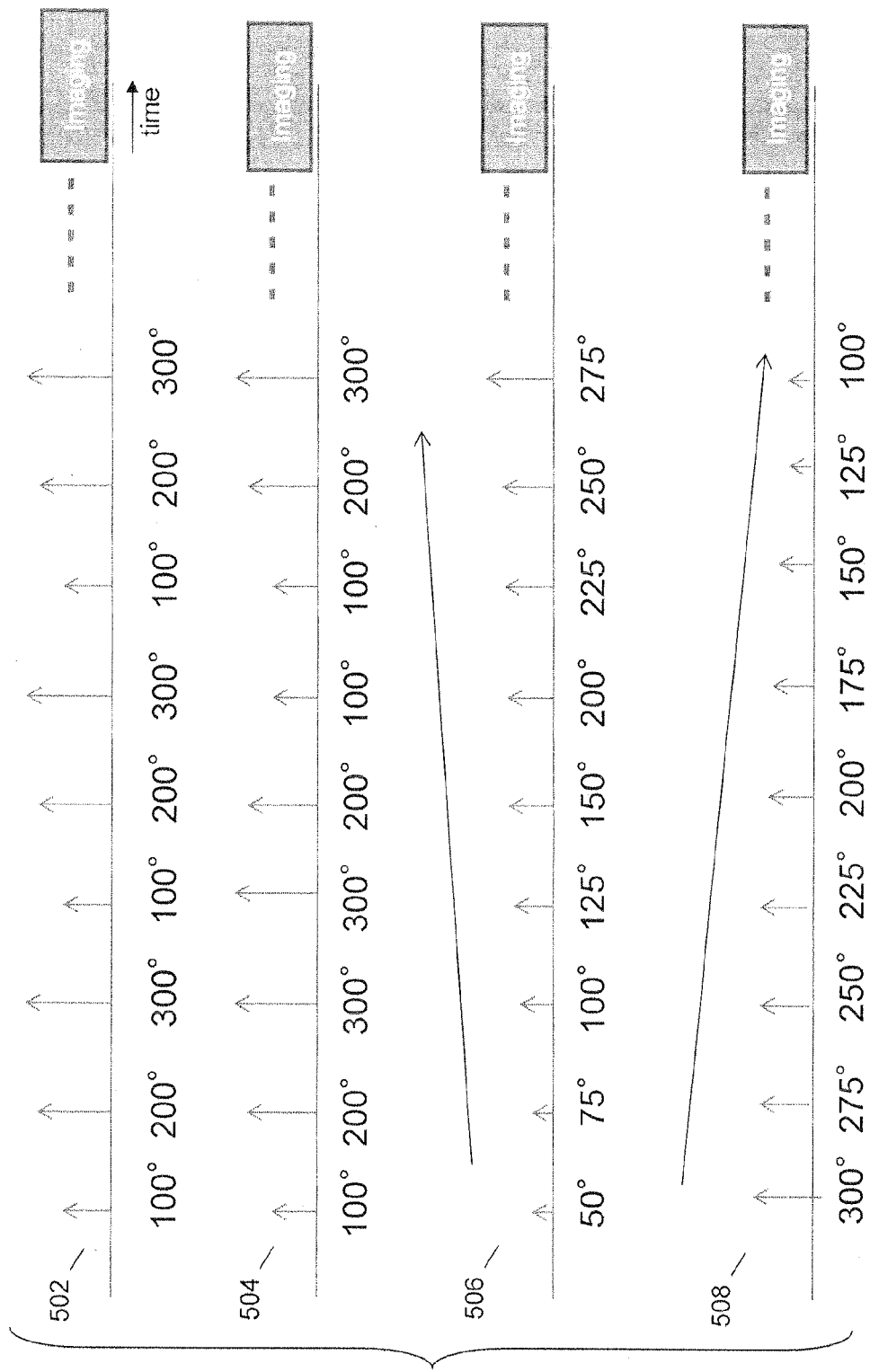
FIG. 5 is a representation of pulse sequences, each comprising MT pulses of multiple frequencies and with varying flip angles.

FIG. 5 illustrates four pulse sequences 501-508, each comprising MT pulses of multiple frequencies and also with varying flip angles (as indicated), followed by an MR imaging pulse sequence. The ability provided in embodiments to vary the flip angle of MT pulses in a sequence of multiple pulses allows for controlling the specific absorption rate (SAR) for energy being absorbed by the patient being imaged. For example, the flip angles of respective different frequency MT pulses in the sequence can be set so that the SAR due to the entire MT pulse sequence does not exceed a predetermined value.

The flip angles of the respective pulses may be configured in many ways. According to some embodiments, the flip angles of the pulses increase as the pulse position becomes closer to the imaging pulses. For example, the MT pulses may start from a low flip angle and gradually increase until that last MT pulse is the closest to 90° such that it is the closest in flip angle to the following imaging sequence pulse. In another example, as in the pulse sequence 508, the MT pulses may start from a high flip angle (e.g., 300°) and gradually decrease until the last MT pulse is the closest to 90° (e.g., 100°). The imaging sequence pulses typically include a 90° pulse as the first pulse in the imaging pulse sequence. In some other embodiments, the flip angles increase as the pulse positions get farther away from the imaging pulses. In yet other embodiments, other arrangements of flip angle values are possible.

The ability to variably control the flip angle of the successive MT pulses provide for embodiments to have lower SAR than the SAR caused by conventional single frequency pulse sequences which typically have a relatively large fixed flip angle for all MT pulses.

In some embodiments, the MT pulse sequence may include multiband RF pulses for MT saturation. Each multiband RF pulse includes two or more frequencies (e.g., excites two or more types of protons of macromolecules). Each multiband pulse may be configured in order to be selective in a range of frequencies. The multiband RF pulses irradiate the multiple MT pulse frequencies selectively. Multiband RF pulses provide for irradiating selected multiple frequencies simultaneously. For example, a multiple frequency selective pulse to select such as 3.5 ppm, 2.0 ppm and 1.0 ppm may be configured by changing the changing bandwidth or frequency, or both bandwidth and frequency of the pulse.

Figure 6:
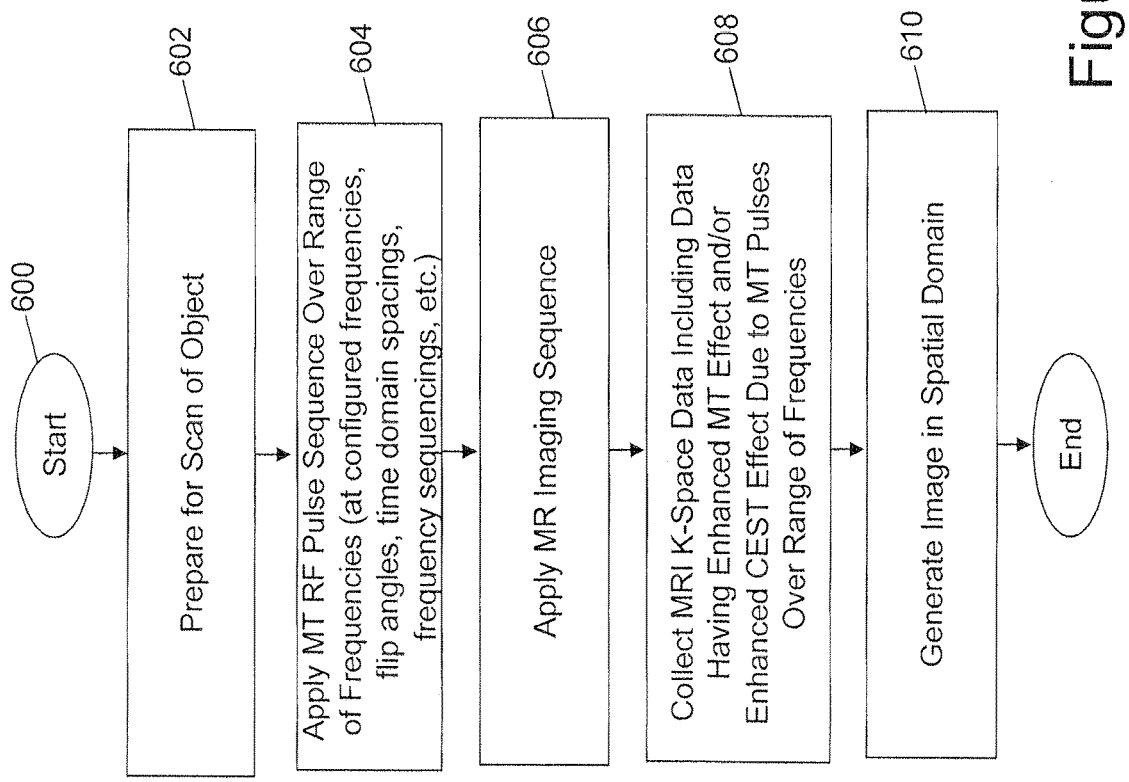
FIG. 6 is a flowchart of a method for enhanced MT/CEST effects, in accordance with one or more embodiments.

FIG. 6 illustrates a flowchart of a method for enhancing the MT effect and/or CEST effect, according to one or more embodiments. Operations 602-610 may be performed and/or controlled by MRI data processor 42, MRI system controller 22, and/or MRI sequence controller 30 shown in FIG. 1.

After entry at 600, at operation 602, the object (e.g., patient) and the MRI system is prepared for scanning. Preparation may include selecting or specifying a pulse sequence that includes an MT pulse sequence before the imaging pulse sequence. The MT pulse sequence includes pulses over a specified range of frequencies. In some embodiments, the individual frequencies that are to be included in the MT pulse sequence are configurable.

The MT pulse sequence may be configurable, or may have been preconfigured, to include variations in the duration between respective pulses and/or flip angles of the respective pulses. The sequence may include multiband pulses, and/or have the pulses arranged in accordance with a selected pattern. The MT pulse sequence, in some embodiments, may correspond to one or more of the pulse sequences represented in FIGS. 3-5 and/or may include multiband pulses.

At operation 604, the MT pulse sequence with multiple frequencies is applied to the object in the MRI gantry. Consecutive MT pulses of multiple frequencies are applied to a selected area of the object. The application of MT pulses of multiple frequencies causes MT effects of a plurality of different types of bound protons to take place during the same scan interval.

At operation 606, the MR imaging pulse sequence is applied to the object. The MR imaging pulse sequence may typically include one or more excitation pulses, such as, for example, 90° or 180° excitation pulses to stimulate creation of NMR spin echo RF responses.

At operation 608, NMR spin echo data responsive to the imaging pulses are collected as MR k-space data. Operations 604-608 may be repeated for multiple scan intervals to acquire sufficient MR k-space data.

The collected MR data includes enhancements in contrast due to MT effect and/or CEST effect, thereby yielding an MRI image in the spatial domain at operation 610 with improved contrast in certain areas affected by MT effects and/or CEST effects.

In embodiments disclosed herein, multiple frequency MT pulses are incorporated in a sequence of MT pulses. By using multiple frequency MT pulses, the embodiments obtain improved MT images relative to MT effects obtained by applying single frequency offsets.

In embodiments, the CEST effect from the multiple frequency components in the MT pulse sequence may be higher due to multiple irradiations of a range of frequencies that include, for example, amide (—NH, at 3.5 ppm), amine (—NH2, at approximately 2 ppm) and hydroxyl (—OH, at 1 ppm). By applying MT pulses at multiple frequencies within a range of 1 to 3.5 ppm, as provided for in embodiments, one can obtain a combined CEST effect due to interactions with multiple different types of protons. As a result, less acquisition time is required when compared to separately acquiring the MT effects of each of the different types of protons.

Moreover, some embodiments provide for lowering the SAR by applying variable flip angles in MT pulse sequence.

While certain embodiments have been described, these embodiments have been presented by way of example only and are not intended to limit the scope of the inventions. Indeed, the novel embodiments described herein may be embodied in a variety of other forms; furthermore, various, omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
    an MRI gantry including a static magnetic field coil, gradient magnetic field coils, at least one radio frequency (RF) coil configured to transmit RF nuclear magnetic resonance (NMR) RF excitation pulses into an imaging volume, and to receive NMR spin echo RF signals from an object located in the imaging volume; and
    control circuits configured to control gradient magnetic fields generated by said gradient magnetic field coils, and to transmit/receive RF signals to and from said at least one RF coil, the control circuits being configured to perform operations comprising:
  applying to the imaging volume a sequence of magnetic transfer (MT) RF pulses including at least two different MT frequencies;
  thereafter applying at least one MR imaging sequence to the imaging volume; and
  receiving NMR spin echo RF responses from said at least one RF coil.

2. The MRI system according to claim 1, wherein one or more of the following parameters are operator configurable:
  (a) frequency of respective pulses in the sequence of MT pulses,
  (b) bandwidth of respective pulses in the sequence of MT pulses,
  (c) both frequency and bandwidth of respective pulses in the sequence of MT pulses,
  (d) interval between consecutive pulses in the sequence of MT pulses,
  (e) ordering of respective frequencies in the sequence of MT pulses, and
  (f) flip angles of respective pulses in the sequence of MT pulses.

3. The MRI system according to claim 1, wherein the sequence of MT pulses includes at least one of: (a) respective MT pulses having different discrete frequencies, (b) different time intervals between respective pairs of consecutive pulses, and (c) respective MT pulses having different flip angles.

4. The MRI system according to claim 1, wherein the sequence of MT pulses comprises RF pulses at a plurality of different frequencies, respective ones of the frequencies respectively corresponding to a different selected offset from a free water NMR resonance frequency.

5. The MRI system according to claim 1, wherein the sequence of MT pulses comprises pulses that are spaced from one another differently in the time domain.

6. The MRI system according to claim 1, wherein the different MT frequencies range from approximately 1 ppm (parts per million) to approximately 3.5 ppm offset from the NMR resonance frequency of free water.

7. The MRI system according to claim 6, wherein the sequence of MT pulses comprises consecutive repeated subsequences, said subsequences including a first pulse, second pulse, and a third pulse, having discrete values respectively corresponding substantially to 1 ppm, 2 ppm, and 3.5 ppm from the NMR resonance frequency of free water.

8. The MRI system according to claim 1, wherein the sequence of MT pulses includes at least one multiband RF pulse, the multiband RF pulse comprising a plurality of different frequencies.

9. The MRI system according to claim 1, wherein at least a part of the sequence of MT pulses comprise a sequence of different frequency RF pulses occurring at respectively different time intervals.

10. The MRI system according to claim 1, wherein at least a part of the sequence of MT pulses comprises pulses of respectively different frequencies and respectively different flip angles.

11. The MRI system according to claim 10, wherein the respectively different flip angles are dimensioned to keep a specific absorption rate (SAR) caused by an MRI process including the sequence of MT pulses to be below a specified value.

12. The MRI system according to claim 10, wherein the MT pulses in the MT sequence closer to the subsequent imaging pulse sequence have larger flip angles than MT pulses located farther from the imaging pulse sequence.

13. The MRI system according to claim 1, wherein instructions for performing said operations are stored in a non-transitory computer readable storage medium.

14. A magnetic resonance imaging (MRI) method for use in an MRI system having a gantry, a radio frequency (RF) transmitter for transmitting RF pulses to an object in the gantry, and a RF receiver configured to receive RF echo data from the object in the gantry, said method comprising:
  applying, using the RF transmitter, a sequence of RF magnetic transfer (MT) pulses including different RF frequencies before applying an MRI data acquisition sequence to an object to be imaged while the object is in the gantry; and
  collecting, using the RF receiver, MR data corresponding to nuclear magnetic resonance (NMR) radio frequency (RF) spin echo signals responsive to the MRI data acquisition sequence.

15. The MRI method according to claim 14, wherein one or more of the following parameters are operator configurable:
  (a) frequency of respective pulses in the sequence of MT pulses,
  (b) bandwidth of respective pulses in the sequence of MT pulses,
  (c) both frequency and bandwidth of respective pulses in the sequence of MT pulses,
  (d) interval between consecutive pulses in the sequence of MT pulses,
  (e) ordering of respective frequencies in the sequence of MT pulses, and
  (f) flip angles of respective pulses in the sequence of MT pulses.

16. The MRI method system according to claim 14, wherein the sequence of MT pulses includes at least one of: (a) respective MT pulses having different discrete frequencies, (b) different time intervals between respective pairs of consecutive pulses, and (c) respective MT pulses having different flip angles.

17. The MRI method according to claim 14, wherein the sequence of MT pulses comprises RF pulses at a plurality of different frequencies, respective ones of the frequencies respectively corresponding to a different selected offset from a free water NMR resonance frequency.

18. The MRI method according to claim 14, wherein the sequence of MT pulses comprises pulses that are spaced from one another differently in the time domain.

19. The MRI method according to claim 14, wherein the different MT frequencies range from approximately 1 ppm (parts per million) to approximately 3.5 ppm offset from the NMR resonance frequency of free water.

20. A magnetic resonance imaging (MRI) system comprising:
  an MRI gantry including a static magnetic field coil, gradient magnetic field coils, at least one radio frequency (RF) coil configured to transmit RF nuclear magnetic resonance (NMR) RF excitation pulses into an imaging volume, and to receive NMR spin echo RF signals from an object located in the imaging volume; and
  control circuits configured to control gradient magnetic fields generated by said gradient magnetic field coils, and to transmit/receive RF signals to and from said at least one RF coil, the control circuits being configured to perform operations comprising:

applying to the imaging volume a sequence of magnetic transfer (MT) RF pulses having variable flip angles dimensioned to keep a specific absorption rate (SAR) caused by an MRI process including the sequence of MT pulses to be below a specified value;

thereafter applying at least one MR imaging RF sequence to the imaging volume; and receiving NMR spin echo RF responses from said at least one RF coil.

\* \* \* \* \*